Figure 1:
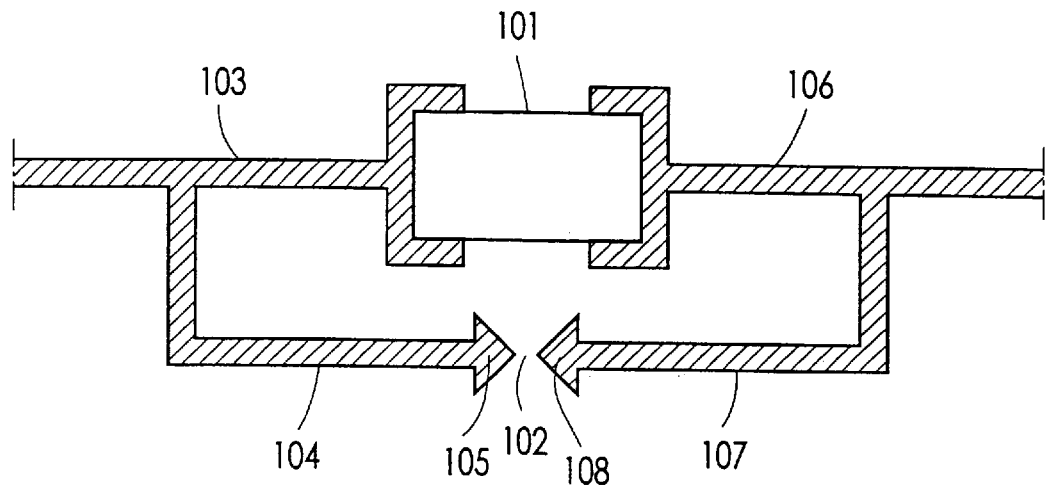

United States Patent
Hansson et al.

[19]

[11] Patent Number: 6,084,759
[45] Date of Patent: Jul. 4, 2000

[54] ARRANGEMENT FOR PROTECTION AGAINST ELECTROSTATIC DISCHARGE IN ELECTRONIC APPARATUSES

[75] Inventors: Mats Hansson, Malmö; Johan Uggmark, Lund; Anders Onshage, Malmö, all of Sweden

[73] Assignee: Telefonaktiebolaget LM Ericsson, Stockholm, Sweden

[21] Appl. No.: 09/053,066

[22] Filed: Apr. 1, 1998

[30] Foreign Application Priority Data

Apr. 2, 1997 [SE] Sweden .................................. 9701195

[51] Int. Cl.[7] ...................................................... H02H 1/00
[52] U.S. Cl. .............................. 361/111; 361/56; 361/112; 361/301.2
[58] Field of Search .............................. 361/301.1, 301.2, 361/303, 306.3, 56, 111, 112, 129, 130

[56] References Cited

U.S. PATENT DOCUMENTS

| | | | |
|---|---|---|---|
| 4,586,105 | 4/1986 | Lippmann | 361/117 |
| 4,891,730 | 1/1990 | Saddow et al. | 313/308 |
| 5,309,841 | 5/1994 | Hartman et al. | 102/202.4 |
| 5,357,397 | 10/1994 | Leary | 361/220 |
| 5,583,733 | 12/1996 | Cronin | 361/111 |
| 5,599,205 | 2/1997 | Cronin | 439/507 |
| 5,656,530 | 8/1997 | Leary | 438/639 |

FOREIGN PATENT DOCUMENTS

| | | |
|---|---|---|
| 28894 | 5/1914 | United Kingdom . |
| 2 049 299 | 12/1980 | United Kingdom . |
| 95/21481 | 8/1995 | WIPO . |

*Primary Examiner*—Dean A. Reichard
*Assistant Examiner*—Eric Thomas
*Attorney, Agent, or Firm*—Burns, Doane, Swecker & Mathis, L.L.P.

[57] ABSTRACT

For protection against electrostatic discharge in electronic apparatuses, a circuit or a component having a connected signal conductor and a discharge conductor connected thereto, is provided with a pointed free end facing and spaced from a pointed free end of a feed conductor together forming a spark gap between the discharge conductor and the feed conductor. Each of the feed conductor and the discharge conductor is arranged with several points forming multiple spark gaps between them.

6 Claims, 5 Drawing Sheets

ARRANGEMENT FOR PROTECTION AGAINST ELECTROSTATIC DISCHARGE IN ELECTRONIC APPARATUSES

This application claims priority under 35 U.S.C. §§119 and/or 365 to SE 9701195-1 filed in Sweden on Apr. 2, 1997; the entire content of which is hereby incorporated by reference.

FIELD OF THE INVENTION

The present invention relates to an arrangement for protection against electrostatic discharge in electrical apparatuses, and more particularly to spark gaps arranged in connection with circuits or components.

PRIOR ART

The problem with electrostatic discharge (ESD) in electrical apparatuses, circuits and components is well-known. Electrostatic charge arise from friction between two different materials. A common reason for electrostatic charge is that a person walks on a carpet or moves a piece of furniture. High electrostatic voltage levels up to several tens of kVs have been measured after a person has walked on a carpet. At physical touch or other handling the resulting charge can be transmitted to circuits and components sensitive to electrostatic discharge. The sensitivity of the circuits to electrostatic discharge is also depending on which circuit family the circuit belongs to or the technology used. The amount of the transmitted electrostatic discharge from a person to an apparatus or a circuit is depending on for example the material of the floor, the material of the sole of the shoes, the relative humidity in the room and the chassis of the apparatus and its grounding. Therefore, sensitive apparatuses and circuits are commonly provided with different protection arrangements such as resistances or zener diodes.

In order prevent errors due to static discharge from occurring, the one who handles the circuits can be grounded by a connection from the wrist to earth and the floors can be covered with conductive or semiconductive surface layers. It is also important with a good handling of the components by storing them in protective boxes such as storage boxes of semiconductive material. Additionally, protective circuits can be integrated in electrostatic apparatuses and components.

There are problems connected with all of the above mentioned methods and arrangements for protection of apparatuses against static discharge. A connection from the user to earth is often awkward to obtain and in many cases inconvenient. Particular difficulties arise in connection with normal use of portable apparatuses such as mobile phones or the like. It is costly to cover floors with conductive or semiconductive surface layers. Specially designed protective boxes also result in cost increases and they can be bulky. In the case of integration of protective circuits, it has not been possible to hitherto achieve sufficient and durable protection. This is particularly true when different components and apparatuses are handled by a regular user.

A known technique for protection against electrostatic discharge is to create a spark gap between a signal connection and the ground connection of a component, one connection of which is connected to the ground. The spark gap is arranged either as a pattern in a conductive layer on a printed circuit card or as connections to a component arranged in the path between the signal and the ground.

For example, one connection of the component comprises a signal conductor with a projecting discharge conductor shaped as an arrow point, while the other connection of the component is grounded. A projecting ground conductor, also shaped as an arrow point, is directed with its point against the point of a signal conductor with a small space between the points, thereby forming a spark gap.

When the electrical field between the points exceeds a breakthrough voltage a spark jumps over the gap and discharges the associated circuit. In that way the electrical circuit is protected, because the electrostatic discharge occurs at a location where it can not damage the circuit.

If the spark gap is repeatedly exposed to discharges the protection against ESD is reduced concurrently with a decrease of the sharpness of the points, because the function is depending on very sharp points.

In the design of electrical apparatuses, electronic designers have to consider not only electrostatic discharge but also radiofrequency (RF) noise, which can be picked up by external means. To secure that RF-noise does not interfere with other circuits in the apparatuses, every connection or attachment is provided with an RF-bypass, in most cases in the form of a chip capacitor.

By utilizing both a bypass capacitor for RF and a spark gap for ESD protection according to prior technique problems with the layout of the printed circuit card may arise, for example due to that the available surface area on the printed circuit card is limited.

SUMMARY

Therefore, it is an object of the present invention to accomplish a sufficiently effective and durable protection against electrostatic discharge for components, circuits and apparatuses even at repeated spark discharges.

A further object is to obtain protection against ESD in close connection to electrical connections or attachments to prevent the high voltage generated by the discharge from reaching and thereby causing damages to, for example, circuits arranged on a printed circuit card.

Still another object of the invention is to obtain an improved protection against repeated spark discharges, which protection does not occupy a larger space than prior art protections.

Such a protection is obtained by means of an arrangement comprising several spark gaps according to the characterizing features of claim 1 and the embodiments thereof according to the subclaims.

DRAWINGS

Figure 2:
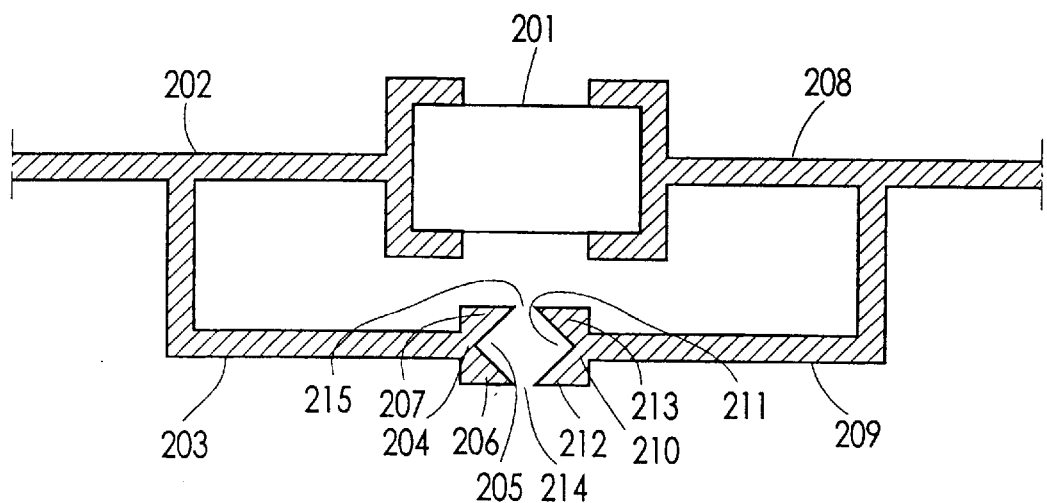
Figure 3:
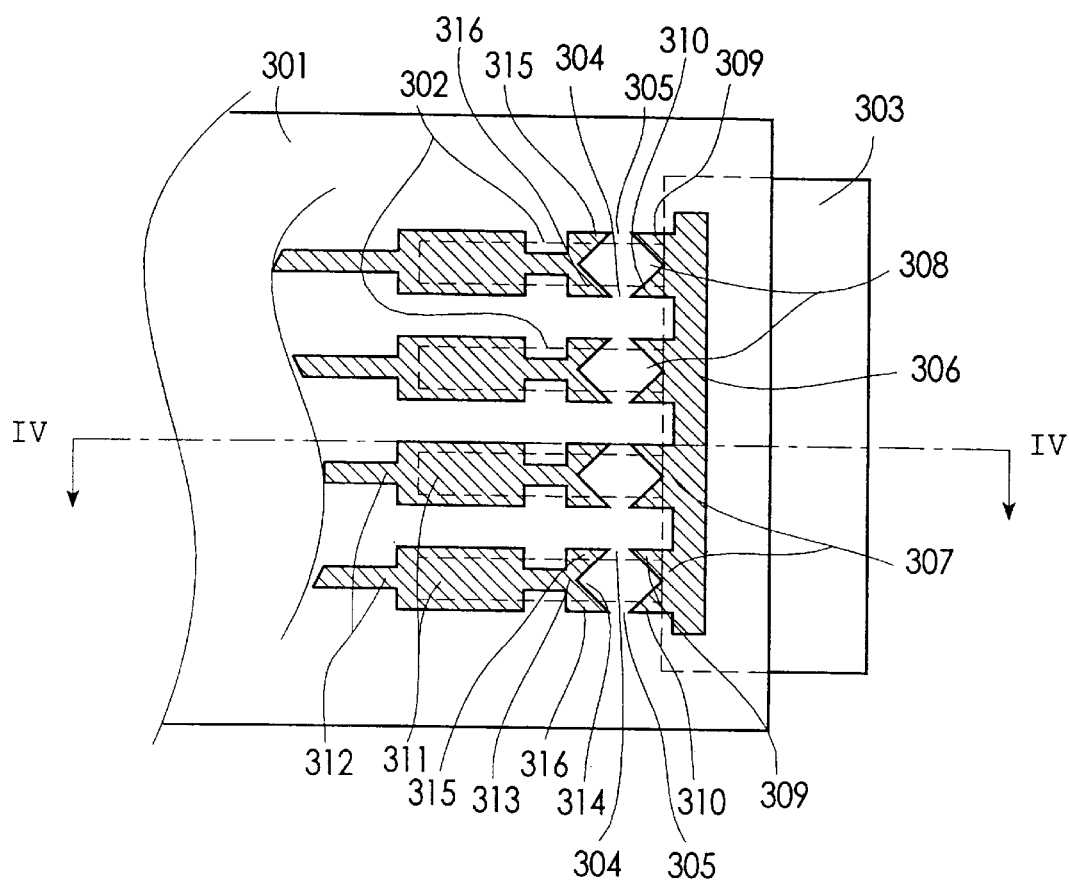
Figure 4:
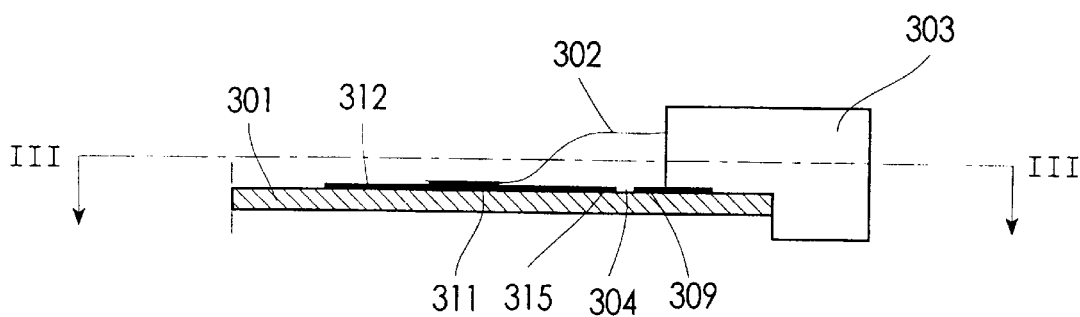
Figure 5:
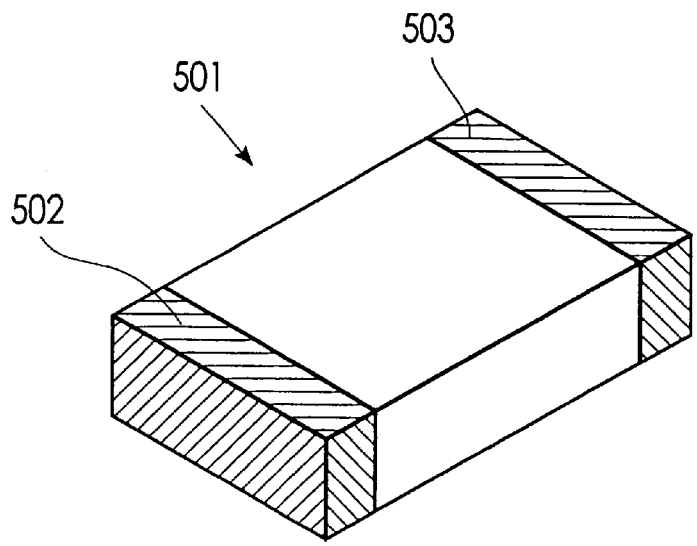
Figure 6:
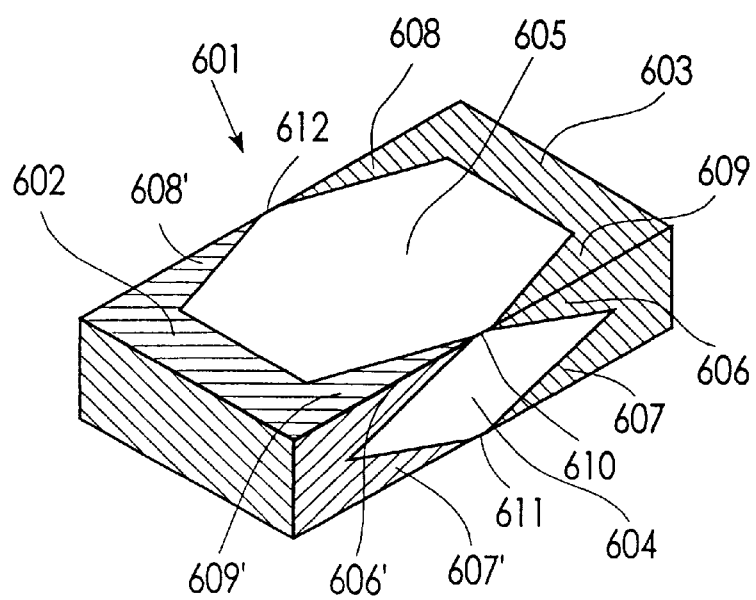
Figure 7:
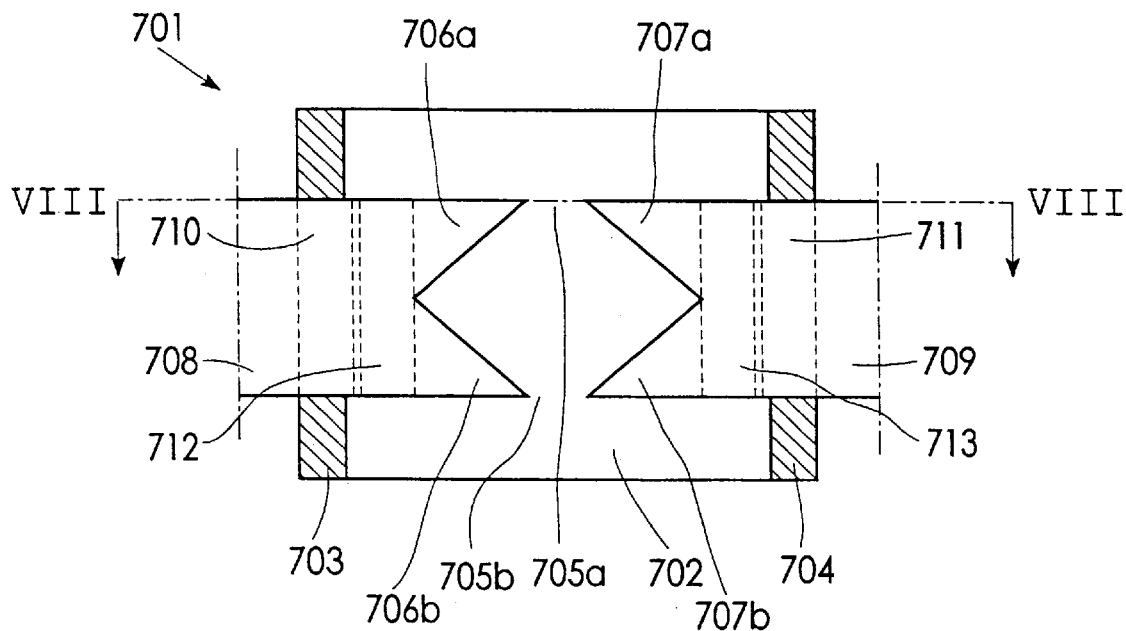
Figure 8:
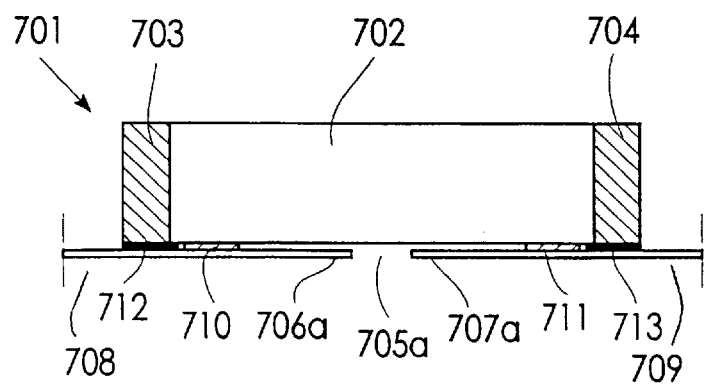
Figure 9A:
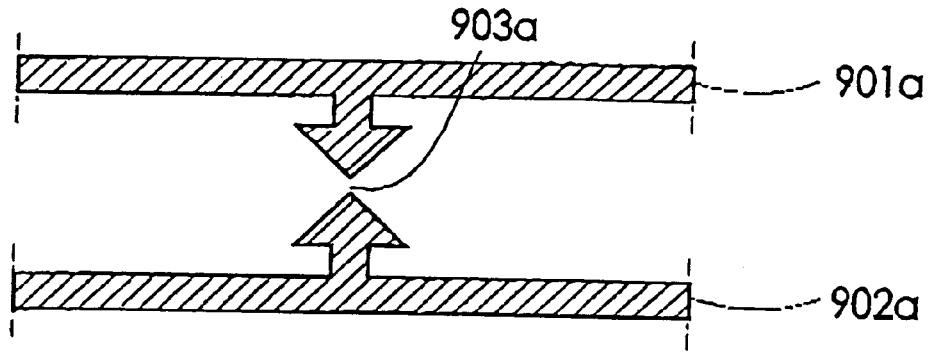
Figure 9B:
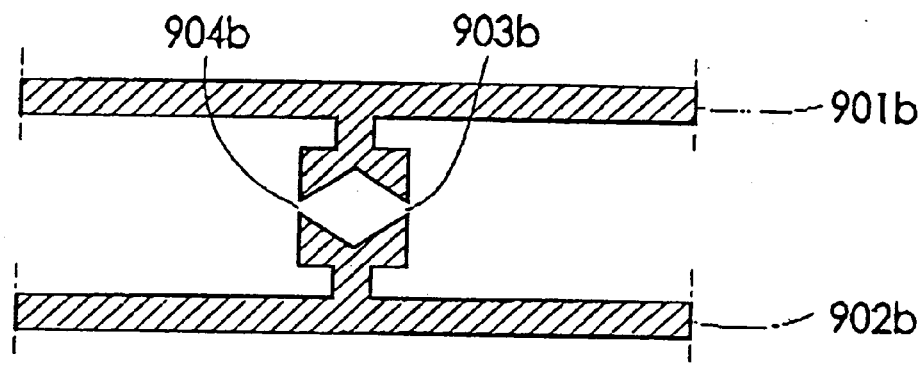
Figure 9C:
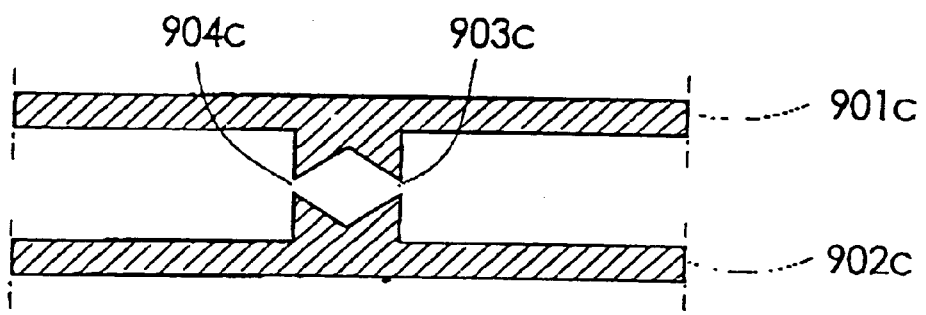

The invention will be described below with reference to the accompanying drawings, in which FIG. 1 schematically shows a circuit provided with a protection against electrostatic discharge in the form of a spark gap according to a prior art technique;

FIG. 2 schematically shows a circuit provided with a protection against electrostatic discharge in the form of several spark gaps according to the invention;

FIG. 3 schematically illustrates a printed circuit card with protection against electrostatic discharge, associated with a contact, with several spark gaps of FIG. 2, in a cross section along the line III—III in FIG. 4;

FIG. 4 shows the printed circuit card of FIG. 3 in cross section along the line IV—IV;

FIG. 5 schematically shows a component used for RF-bypass according to a prior art technique;

FIG. 6 schematically shows a component according to FIG. 5 provided with protection against electrostatic discharge, where a component itself comprises several spark gaps;

FIG. 7 schematically shows a combined component card with a component arranged above the spark gaps;

FIG. 8 shows the component card in FIG. 7 in cross section along the line VIII—VIII;

FIG. 9A schematically illustrates an arrangement with one single spark gap arranged between two conductors according to prior art technique;

FIG. 9B schematically illustrates an arrangement with a multiple spark gap according to the invention arranged between two conductors; and FIG. 9C schematically illustrates a further example of an embodiment of a multiple spark gap arranged between two conductors.

DESCRIPTION

A prior art technique for protection of an apparatus against electrostatic discharge is shown in FIG. 1, according to which a component 101 has a single spark gap 102 for protection against electrostatic discharge. One connection of the component is formed of a signal conductor 103 of an electrically conductive material, such as a copper foil. The conductor 103 has a projecting discharge-conductor 104 having a free end in the shape of an arrow point or head 105.

A ground-conductor 106 is connected to the other connection of the component. In the same way as the conductor 103 is provided with a discharge conductor 104 the ground-conductor 106 is provided with a projecting feed conductor 107 having a free end in shape of an arrow point or head 108. The conductor 106 is also formed of an electric conductive material.

The two points 105 and 108 are facing each other with a space inbetween, forming a spark gap 102.

When the electrical field between the points exceeds a breakthrough voltage a spark jumps over the gap 102 and discharges the associated circuit 101. In that way the electric circuit is protected since the spark is forced to jump over at a particular point where it can not damage the circuit.

If the spark gap in FIG. 1 is exposed to repeated discharges or if some of the points are damaged the protection against ESD is reduced, because the function is depending on very sharp points.

Problems arising in connection with repeated discharges can be solved with an arrangement comprising at least two spark gaps according to the invention, illustrated in FIG. 2.

In the arrangement of FIG. 2 there is a component 201, one connection of which is formed of a signal conductor 202 of electrically conductive material, such as copper foil. The conductor 202 has a projecting discharge conductor 203, which at its end—instead of an arrow point as in FIG. 1—has an end portion 204, rectangular in the embodiment and with a triangular cut 205 arranged therein forming two integrated, essentially triangular points 206 and 207.

A ground-conductor 208 is connected to a second connection of the component 201. In the same way as the conductor 202 is provided with a discharge conductor 203 the conductor 208 is provided with a projecting feed-conductor 209. At its end the feed-conductor 209 also has an end portion 210, which is rectangular also in the embodiment, with a triangular cut 211 arranged therein forming two essentially triangular points 212 and 213.

Hence, two spark gaps 214 and 215, one between the points 206 and 212 and one between the points 207 and 213, are arranged on an area not larger than what is occupied by a single spark gap 202 according to the prior art technique, illustrated in FIG. 1.

The way in which spark gaps according to the invention is formed gives an increased ESD-protection and redundancy to the system. If one of the spark gaps in FIG. 1 is exposed to repeated spark discharges or if some of the points in the gap are damaged in another way there is still an intact spark gap, thereby providing a maintained protection of the circuit. Additionally, the relation applies that the sharper points forming the spark gap the more effective is the spark discharge. As a result a spark discharge in the multiple gap in FIG. 2 becomes more effective than the prior art gap in FIG. 1.

Thus, the object of the present invention is obtained, i.e. sufficiently favorable and durable protection against electrostatic discharge for components, circuits and apparatuses even at repeated discharges.

In the embodiment mentioned above the points, between which the spark gaps are arranged, are formed of rectangular end portions with a triangular cut in each of the end portions. Thus, there are two points in each end portions. For a person of ordinary skill in the art it will be apparent that this is in no way the only possibility to obtain multiple points. Instead of by a triangular cut the points can be obtained by means of a trapezium cut or a circle sector cut etc. in the end portions. It is also possible to have more than two points in each end portion by arrangement of several cuts in each end portion 204 and 210. Thus, the points and even the spark gaps can be more than two and have several different shapes without being outside the scope of the appended claims and what is intended to be protected.

Means for protection against ESD are often arranged close to electrical contacts or attachments to prevent a discharge, generated by the high-voltage, from reaching and thereby causing damages for example circuits arranged on printed circuit cards. The charge ought to be coupled to the ground as fast as possible. It is, however, not necessary that the grounded feed-conductor projects from the ground conductor attached to the component. The grounded feed-conductor can be formed of a separate element, arranged on a grounded chassis or connected to ground in another way.

A printed circuit card 301 is shown in FIG. 3, provided with a protection against electrostatic discharge at contact means 302 close to a contact 303, comprising several spark gaps per contact means according to the arrangement of FIG. 2.

Each means 302 (four units in the embodiment), forming projections from the contact 303, is provided with a protection having two spark gaps 304 and 305 according to the principle shown in FIG. 2.

The spark gaps 304 and 305 at each means 302 are formed by means of a grounded conductive pattern strip 306, arranged on a printed circuit card 301 and partly below the contact 303. Close to each means 302, a projecting section 307 is arranged on the strip 306 directed towards the surface of the printed circuit card; the section 307 is in the embodiment rectangular with a triangular cut 308, thereby exhibiting two substantially triangular points 309 and 310 integral with each other.

Each means 302 is attached to a signal conductor 312 at a joint 311. At one end the conductor 312 is provided with a rectangular end section 313 facing the contact 303 with a triangular cut 314 so that the end section exhibits two substantially triangular points 315 and 316.

Thus, the two spark gaps 304 and 305, between the points 309 and 315 and between the points 310 and 316, respectively, are arranged below the means 302 of the contact 303, whereby all means are protected without occupying additional space on the printed circuit card, also illustrated in FIG. 4. This is particularly desirable in small apparatuses, for example mobile phones or the like.

In the design of electrical apparatuses, electronic designers have to consider electrostatic discharge as well as radio frequency (RF) noise, which can be picked up by external means. In order to secure that RF noise does not interfere with other circuits in the apparatus each of the contacts or attachments is provided with an RF-bypass, in most cases in the form of a chip capacitor.

Such a component 501 is shown in FIG. 5 and comprises two terminals 502 and 503, shown as shadowed sections in the drawing. Also this component has to be protected against electrostatic discharge. A solution thereof can be obtained in that the component itself comprises spark gaps. This solution is illustrated by an example in FIG. 6. A component 601 is here provided with two terminals 602 and 603. Unlike the rectangular terminals in FIG. 5, the terminals 602 and 603 of the component 601 in FIG. 6 are on two long sides, one of which is apparent in the drawing and referred to as 604, and on two base sides, one of which is referred to as 605 and also apparent in the figure, provided with projecting sections 606, 607 and 606', 607' on the shown long side 604 and projecting sections 608, 609 and 608', 609' on the shown base side 605. These sections are triangular in the embodiment. Corresponding triangular sections are also provided on the long side and the base side, respectively not shown in the figure.

Thus, a spark gap 610 is accomplished between on one hand a point formed by the sections 606 and 609 and on the other hand a point formed by the opposite sections 606' and 609'. In the corresponding way three further spark gaps are accomplished, two of which spark gaps 611 and 612 are shown in FIG. 6.

Thus, in this case the spark gaps are integrated with the component itself, whereby no extra space is occupied. In this embodiment, the component 601 also has four different spark gaps around the component, which provide for a very good protection against ESD.

It will be apparent to a person of ordinary skill in the art that the projecting sections 606, 607 and 606', 607' and 608, 609 and 608', 609' in another embodiment of the invention can be arranged in another way on the outside of the component, and instead of being triangular the portions can have arbitrary shapes, providing points corresponding to those in the embodiment. For example, spark gaps of the kind illustrated in FIG. 3 can also be used for a component.

In the embodiment, the component has the shape of a parallelepiped, but of course it can have an arbitrary shape.

Sometimes it is necessary to use other components or spark gaps as ESD protection. It is of course desirable, particularly in compact circuit solutions, to have as few components and as little wiring as possible. By utilising both a bypass capacitor for RF and a spark gap for ESD protection according to a prior art technique there is a risk for problems with the layout of the printed circuit card, for example due to that the available surface area on the printed circuit card is limited.

An additional way to solve the above described problem with a bypass capacitor for RF noise which also needs to be provided with additional protection against ESD is shown in FIGS. 7 and 8, where a combined component card 701 is used. A component 702 provided with two terminals 703 and 704 are arranged above two spark gaps 705a and 705b in the drawing. Each of the spark gaps is arranged between two points 706a and 707a, and 706b and 707b, respectively, spaced by a small distance, thereby forming ends of attachment conductors 708 and 709 of the components. Thereby both the bypass effect and the ESD protection are obtained.

It is important to notice that it is necessary at the manufacturing of the above mentioned arrangement that there is a protection mask 710, 711 applied on each of the attachment conductors 708, 709, extending from a location of a conductor where the attachment of a component shall be soldered, in the direction towards the spark gaps 705a and 705b, but not all the way to the gaps. The mask should be present to prevent applied solder 712, 713 from being spread under the components and reducing or in some case short circuiting the spark gaps.

In order to obtain the main object of the present invention, i.e. to improve and maintain ESD protection during a longer time than previously possible, the arrangement having multiple spark gaps according to the principle shown in FIG. 2 is also used herein. If the requirements on ESD protection is lower a single spark gap can be arranged below the component instead.

Further arrangements with spark gaps are shown in FIGS. 9A–9C. As a reference FIG. 9A illustrates an arrangement having a spark gap 903a, according to the prior art technique, between a first conductor 901a and a second conductor 902a.

FIG. 9B illustrates an arrangement with a multiple spark gap mentioned above arranged between a first conductor 901b and a second conductor 902b. The arrangement has two spark gaps in the embodiment, a first spark gap 903b and a second spark gap 904b.

FIG. 9C illustrates another example of an embodiment of a multiple spark gap arranged between a first conductor 901c and a second conductor 902c. This arrangement has also two spark gaps in the embodiment, a first spark gap 903c and a second spark gap 904c.

From the above mentioned examples according to FIG. 9B and FIG. 9C it is apparent that the illustrated multiple spark gaps constitute a better protection against repeated spark discharges without occupying a larger surface area than prior art protections according to the example in FIG. 9A.

We claim:

1. An arrangement for protection against electrostatic discharge in electronic apparatuses, comprising a signal conductor connected to a component having a connected discharge conductor, provided with a first pointed free end section facing and spaced from a second pointed free end section of a feed conductor, together forming a spark gap between the discharge conductor and the feed conductor, wherein each of the end sections has at least a cut forming at least two points on each end section, the first pointed free end section being a first terminal surrounding at least a part of the outside surface of one end of the component, and wherein multiple spark gaps are provided between the discharge conductor and the feed conductor.

2. The arrangement according to claim 1, wherein the second free end section is a second terminal surrounding at least a part of the outside surface or another end of the component, forming multiple spark gaps around at least a part of the component.

3. The arrangement according to claim 2, wherein each terminal has pointed projecting sections on its long sides and pointed projecting sections on its base sides facing pointed projecting sections of the opposite terminal, forming multiple spark gaps around at least a part of the component.

4. The arrangement according to claim 1, wherein each end section is rectangular having at least a triangular cut forming at least two points.

5. The arrangement according to claim 1, wherein each end section is rectangular having at least a trapezium cut forming at least two points.

6. The arrangement according to claim 1, wherein each end section is rectangular having at least a circle sector cut forming at least two points.

* * * * *